United States Patent
Yun et al.

(10) Patent No.: US 11,450,400 B2
(45) Date of Patent: Sep. 20, 2022

(54) CONTROLLER AND OPERATING METHOD THEREOF

(71) Applicant: SK hynix Inc., Gyeonggi-do (KR)

(72) Inventors: Sang Ho Yun, Gyeonggi-do (KR); Soon Young Kang, Gyeonggi-do (KR); Dae Sung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 50 days.

(21) Appl. No.: 17/074,097

(22) Filed: Oct. 19, 2020

(65) Prior Publication Data

US 2021/0327530 A1 Oct. 21, 2021

(30) Foreign Application Priority Data

Apr. 17, 2020 (KR) .................. 10-2020-0046686

(51) Int. Cl.
  *G11C 29/42* (2006.01)
  *G11C 29/12* (2006.01)
  *G11C 29/50* (2006.01)
  *H03M 13/11* (2006.01)
  *H03M 13/29* (2006.01)

(52) U.S. Cl.
  CPC ........ *G11C 29/42* (2013.01); *G11C 29/12005* (2013.01); *G11C 29/50004* (2013.01); *H03M 13/1111* (2013.01); *H03M 13/2948* (2013.01)

(58) Field of Classification Search
  CPC .............. G11C 29/42; G11C 29/12005; G11C 29/50004; H03M 13/1111; H03M 13/2948
  See application file for complete search history.

(56) References Cited

U.S. PATENT DOCUMENTS

| | | | | |
|---|---|---|---|---|
| 8,582,360 B2* | 11/2013 | Park | ................. | G11C 11/5642 365/185.24 |
| 9,798,614 B2* | 10/2017 | Kim | ................. | H03M 13/3707 |
| 2008/0263265 A1* | 10/2008 | Litsyn | ................. | G11C 11/5628 365/185.21 |
| 2016/0378596 A1* | 12/2016 | Kim | ................. | H03M 13/45 714/755 |
| 2017/0177436 A1* | 6/2017 | Lee | ................. | H03M 13/2906 |
| 2018/0350441 A1* | 12/2018 | Kim | ................. | G11C 11/5642 |
| 2019/0068222 A1* | 2/2019 | Lee | ................. | H03M 13/3715 |
| 2020/0409788 A1* | 12/2020 | Kurose | ................. | G06F 11/1068 |

FOREIGN PATENT DOCUMENTS

KR 10-2019-0051561 5/2019

* cited by examiner

*Primary Examiner* — Kyle Vallecillo
(74) *Attorney, Agent, or Firm* — IP & T Group LLP

(57) ABSTRACT

The controller that controls a memory device includes: a processor suitable for controlling the memory device to perform a first soft read operation by using first soft read voltages; and an error correction code (ECC) codec suitable for performing a first soft decision decoding operation based on first soft read data obtained through the first soft read operation, wherein the processor controls the memory device to perform a second soft read operation with an additional read voltage, of second soft read voltages, that is different than any of the first soft read voltages and which is determined based on the first soft read data, according to whether the first soft decision decoding operation failed, and wherein the ECC codec performs a second soft decision decoding operation based on the first soft read data and second soft read data obtained through the second soft read operation.

13 Claims, 13 Drawing Sheets

<IDEAL>

CONTROLLER AND OPERATING METHOD THEREOF

CROSS-REFERENCE TO RELATED APPLICATION(S)

The present application claims priority under 35 U.S.C. § 119(a) to Korean Patent Application No. 10-2020-0046686, filed on Apr. 17, 2020, the disclosure of which is incorporated herein by reference in its entirety.

BACKGROUND

1. Field

Various embodiments of the present disclosure relate to a controller that controls a memory device, and an operating method of the controller.

2. Description of the Related Art

In general, there are two types of semiconductor memory devices: volatile memory devices and non-volatile memory devices. Examples of volatile memory devices includes Dynamic Random Access Memory (DRAM) and Static RAM (SRAM). Examples of non-volatile memory devices include Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

A volatile memory device loses its stored data when its power supply is interrupted, whereas a non-volatile memory device retains its stored data even without power. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1 bit of data is called a single-bit cell or a single-level cell (SLC). A memory cell storing multiple bits of data (i.e., 2 or more bits of data) is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighbouring threshold voltage distributions may overlap. As the neighbouring threshold voltage distributions overlap, read data may include error bits.

FIG. 1 is a threshold voltage distribution schematically illustrating program and erase states of a triple level cell (TLC) non-volatile memory device.

FIG. 2 is a threshold voltage distribution schematically illustrating program and erase states due to characteristic deterioration of the TLC non-volatile memory device.

In an MLC non-volatile memory device, e.g., an MLC flash memory device capable of storing k bits of data in a single memory cell, the memory cell may have one of $2^k$ threshold voltage distributions. For example, a TLC has one of 8 threshold voltage distributions.

Threshold voltages of memory cells programmed for the same data form a threshold voltage distribution due to characteristic differences between memory cells. In a TLC non-volatile memory device, as illustrated in FIG. 1, threshold voltage distributions are formed in correspondence with the data states including 8 program states 'P1' to 'P8'. FIG. 1 shows an ideal case in which threshold voltage distributions do not overlap and have sufficient read voltage margins therebetween.

Referring to the flash memory example of FIG. 2, a memory cell may experience charge loss in which electrons trapped at a floating gate or tunnel oxide film are discharged over time. Such charge loss may accelerate when the tunnel oxide film deteriorates by repeated program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency may cause increases in threshold voltages. As characteristics of memory cells deteriorate, each of the program states 'P1' to 'P8' may be changed, and neighbouring threshold voltage distributions may overlap, as illustrated in FIG. 2.

What is therefore required is a method for precisely reading data stored in memory cells of a semiconductor memory device.

SUMMARY

Various embodiments of the present disclosure are directed to a controller and a memory system, which may accurately and rapidly read data stored in a memory cell.

In accordance with an embodiment of the present invention, the controller that controls a memory device includes: a processor suitable for controlling the memory device to perform a first soft read operation by using first soft read voltages; and an error correction code (ECC) codec suitable for performing a first soft decision decoding operation based on first soft read data obtained through the first soft read operation, wherein the processor controls the memory device to perform a second soft read operation with an additional read voltage, of second soft read voltages, that is different than any of the first soft read voltages and which is determined based on the first soft read data, according to whether the first soft decision decoding operation failed, and wherein the ECC codec performs a second soft decision decoding operation based on the first soft read data and second soft read data obtained through the second soft read operation.

In accordance with an embodiment of the present invention, an operating method of a controller that controls a memory device, the operating method includes: controlling the memory device to perform a first soft read operation by using first soft read voltages; performing a first soft decision decoding operation based on first soft read data obtained through the first soft read operation; controlling the memory device to perform a second soft read operation with an additional read voltage, of second soft read voltages, that is different than any of the first soft read voltages and which is determined based on the first soft read data, according to whether the first soft decision decoding operation failed; and performing a second soft decision decoding operation based on the first soft read data and second soft read data obtained through the second soft read operation.

In accordance with an embodiment of the present invention, an error correcting method of a controller, the method includes: performing a first soft decision decoding operation on first data read using different first read voltages; and performing, when the first decision decoding operation fails, a second soft decision decoding operation on second data according to second read voltages determined on a basis of the first data, the second read voltages, wherein the second read voltages includes one or more of the first read voltages and one or more third read voltages different from the first read voltages, and wherein the second data includes one or more pieces of the first data read by first read voltages during the first soft decision decoding operation and third data read by the one or more third read voltages during the second soft decision decoding operation.

DETAILED DESCRIPTION

Various embodiments of the present disclosure are described below with reference to the accompanying drawings. However, the present disclosure is not limited to the embodiments disclosed below, but may be implemented in various other forms. Thus, the scope of the present invention is not limited to the embodiments described below. The disclosed embodiments are provided to make the present disclosure complete and to enable those skilled in the art to practice the invention. The scope of the present invention, however, may be understood by the claims of the present application. Throughout the specification, reference to "an embodiment," "another embodiment" or the like is not necessarily to only one embodiment, and different references to any such phrase are not necessarily to the same embodiment(s).

Figure 3:
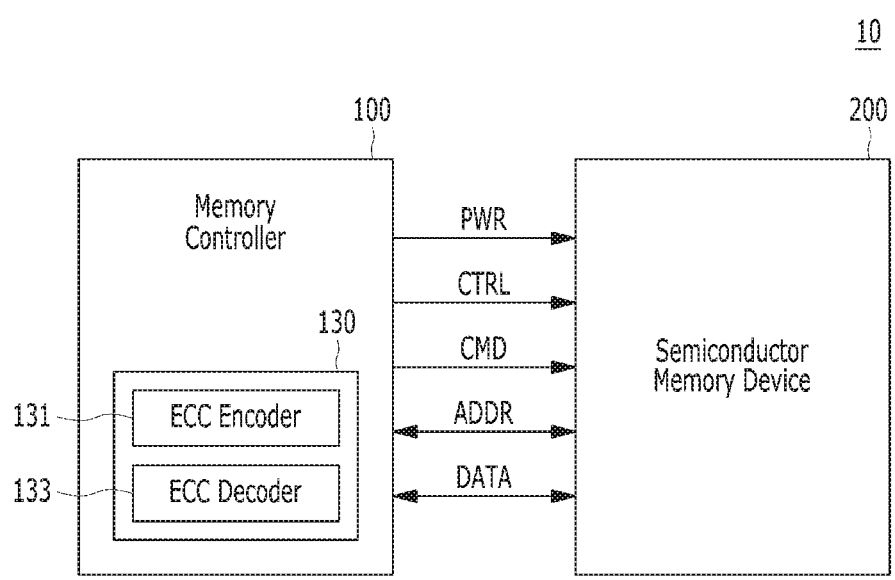
FIG. 3 is a block diagram illustrating a semiconductor memory system in accordance with an embodiment.

FIG. 3 is a block diagram schematically illustrating a semiconductor memory system 10, in accordance with an embodiment of the present invention.

Figure 4A:
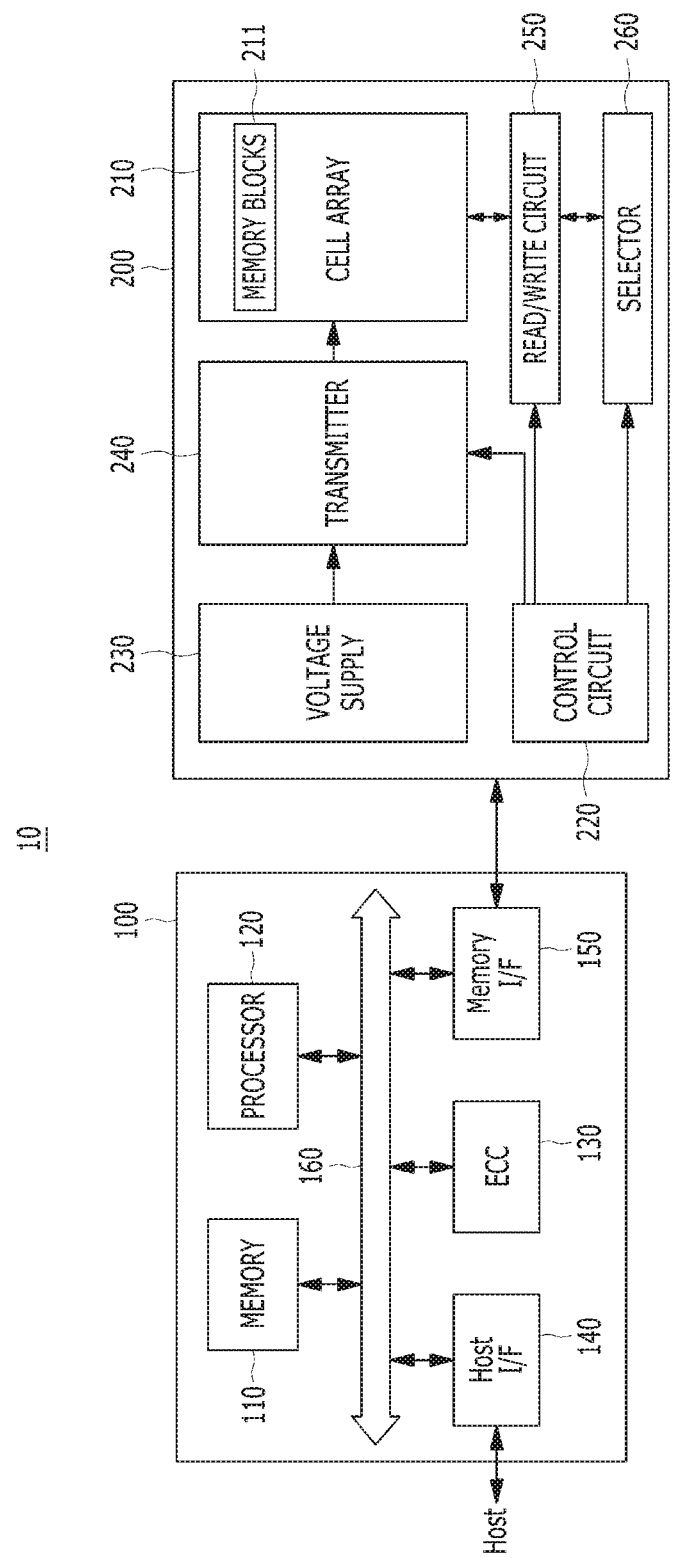
FIG. 4A is a detailed block diagram illustrating a semiconductor memory system, such as that illustrated in FIG. 3.
Figure 4B:
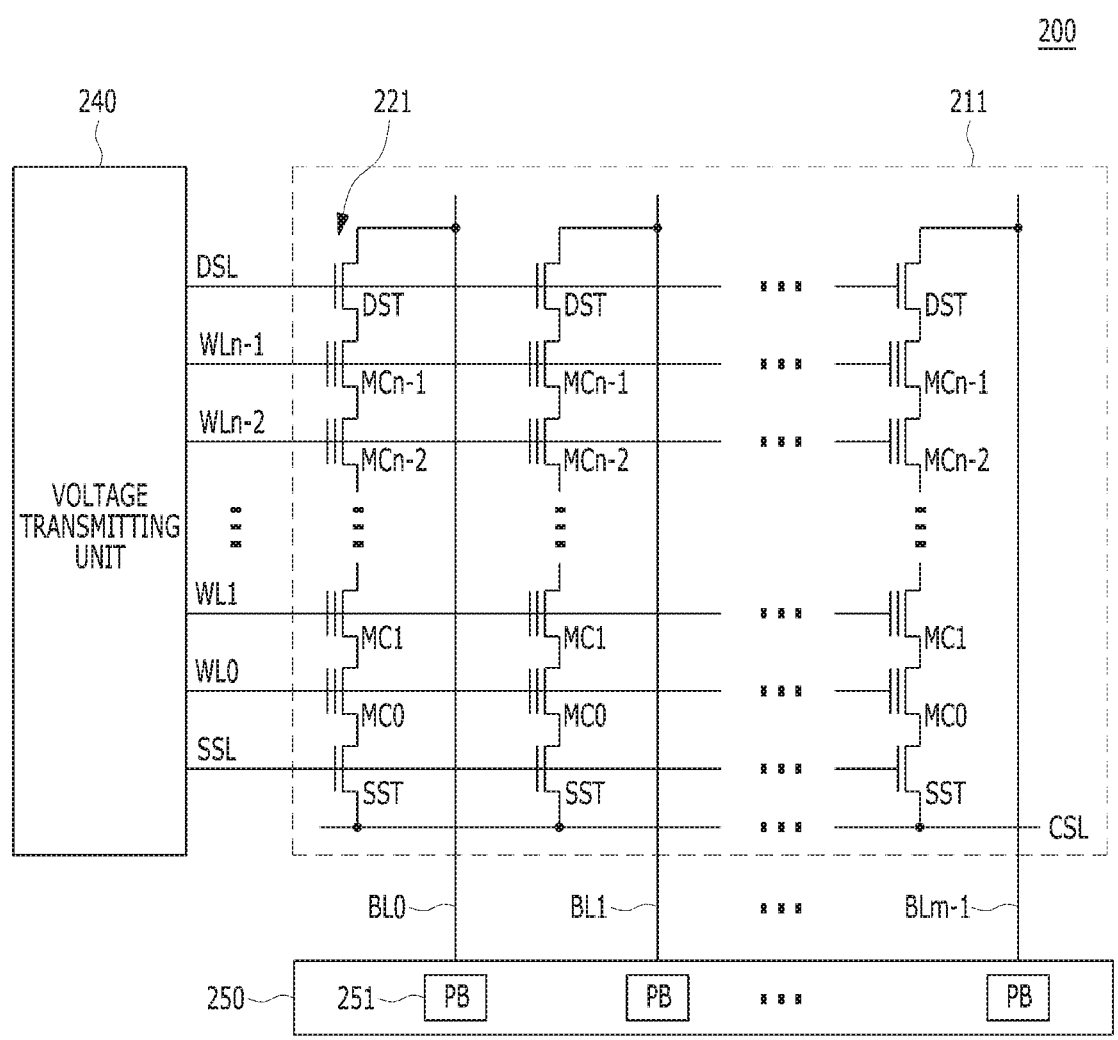
FIG. 4B is a block diagram illustrating a memory block, such as that illustrated in FIG. 4A.

FIG. 4A is a block diagram further illustrating in more detail the semiconductor memory system 10 of FIG. 3, and FIG. 4B is a circuit diagram illustrating an exemplary configuration of a memory block 211 employed in the semiconductor memory system of FIG. 4A.

Referring now to FIGS. 3 to 4B, a semiconductor memory system 10 is provided, according to an embodiment of the present invention. The semiconductor memory system 10 may include a semiconductor memory device 200 operatively coupled to a memory controller 100.

The semiconductor memory device 200 may perform one or more of an erase, a program, and a read operation under the control of the memory controller 100. The semiconductor memory device 200 may receive a command CMD, an address ADDR and data DATA through a plurality of input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and the like.

The memory controller 100 may control overall operation of the semiconductor memory device 200. The memory controller 100 may include an error correction code (ECC) codec 130 for correcting error bits. The ECC codec 130 may include an ECC encoder 131 and an ECC decoder 133.

The ECC encoder 131 may perform error correction encoding on data to be programmed into the semiconductor memory device 200 by adding parity bits to the data. The encoded data with the parity bits may be output to and stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using the parity bits generated by the LDPC encoding operation.

When the number of error bits exceeds the error correction capacity of the ECC codec 130, the ECC codec 130 may not correct the error bits. In this case, the ECC codec 130 may generate an error correction fail signal.

When the number of error bits is within the error correction capacity of the ECC codec 130, the ECC codec 130 may correct the error bits and generate an error correction pass signal.

The memory controller 100 and the semiconductor memory device 200 may be integrated into a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated into a single semiconductor device such as a memory card, such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or of a computing system.

Referring to FIG. 4A, in an embodiment, the memory controller 100 may include, in addition to the ECC codec 130, a memory 110, a processor 120, a host interface 140, a memory interface 150 and a system bus 160.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and/or an integrated drive electronics (IDE).

The memory interface 150 may serve as a memory/storage interface for interfacing the memory controller 100 and the semiconductor memory device 200 such that the memory controller 100 controls the semiconductor memory device 200 in response to a request from the host. When the semiconductor memory device 200 is a flash memory or specifically a NAND flash memory, the memory interface 150 may generate a control signal for the semiconductor memory device 200 and process data to be provided to the semiconductor memory device 2000 under the control of the processor 120. The memory interface 150 may work as an interface (e.g., a NAND flash interface) for processing a command and data between the memory controller 100 and the semiconductor memory device 200. Specifically, the memory interface 150 may support data transfer between the memory controller 100 and the semiconductor memory device 200.

The processor 120 may control overall operation of the semiconductor memory system 10. The processor 120 may drive firmware to control overall operation of the semiconductor memory system 10. The firmware may be referred to as flash translation layer (FTL). Also, the processor 120 may be realized as a microprocessor or a central processing unit (CPU).

The processor 120 may drive the FTL and perform a foreground operation corresponding to a request received from the host. For example, the processor 120 may control a write operation of the semiconductor memory device 200 in response to a write request from the host and control a read operation of the semiconductor memory device 200 in response to a read request from the host.

The memory 110 may serve as a working memory of the semiconductor memory device 200 and the memory controller 100, and store data for driving the semiconductor memory device 200 and the memory controller 100. The memory controller 100 may control the semiconductor memory device 200 to perform read, program and erase operations in response to a request from the host. The memory controller 100 may provide data read from the semiconductor memory device 200 to the host, may store data provided from the host into the semiconductor memory device 200. The memory 110 may store data for the memory controller 100 and the semiconductor memory device 200 to perform these operations.

Figure 1:
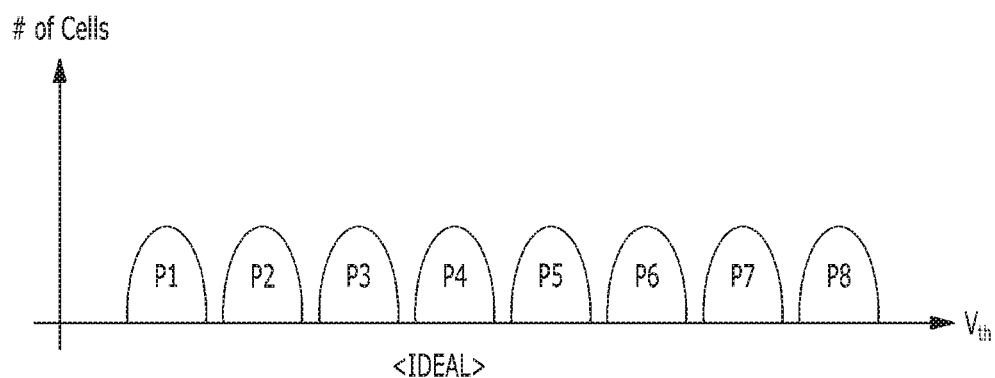
FIG. 1 is a threshold voltage distribution graph illustrating program and erase states of a triple level cell (TLC) non-volatile memory device.
Figure 2:
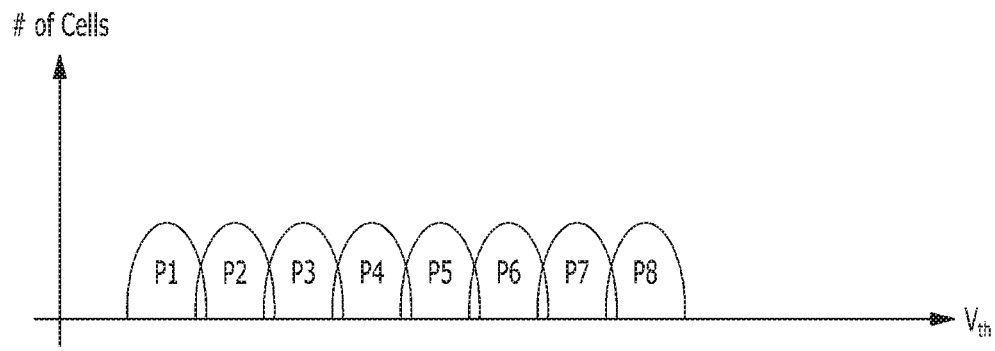
FIG. 2 is a threshold voltage distribution graph illustrating program and erase states of a TLC nonvolatile memory device, which have changed due to characteristic degradation of the TLC nonvolatile memory device.

The memory 110 may be embodied by a volatile memory. For example, the memory 110 may be embodied by static random access memory (SRAM) or dynamic random access memory (DRAM). The memory 110 may be disposed within or externally to the memory controller 100. FIG. 1 exemplifies the memory 110 disposed within the memory controller 100. In another embodiment, the memory 110 may be embodied by an external volatile memory having a memory interface for transferring data between the memory 110 and the memory controller 100.

The ECC codec 130 may detect and correct errors in the data read from the semiconductor memory device 200. The memory interface 150 may interface with the semiconductor memory device 200. The ECC encoder 131 and the ECC decoder 133 may be implemented as different and independent components even though FIG. 4A exemplarily shows the ECC codec 130 including both the ECC encoder 131 and the ECC decoder 133. The CPU 120 may perform various control operations.

In accordance with an exemplary embodiment of the present invention, during a program operation, the ECC codec 130 may perform an LDPC encoding operation on original data which is to be programmed to the semiconductor memory device 200. In such case, during the read operation, the ECC codec 130 may perform an LDPC decoding operation to the LDPC-encoded data or a codeword, which is stored in the semiconductor memory device 200.

The ECC codec 130 may then restore the original data by performing an LDPC decoding operation to the LDPC-encoded data or to the codeword stored in the semiconductor memory device 200.

The semiconductor memory device 200 may include a memory cell array 210, a control circuit 220, a voltage supply 230, a voltage transmitter 240, a read/write circuit 250, and a column selector 260.

The memory cell array 210 may include a plurality of memory blocks 211. User data may be stored in the memory blocks 211. The user data may be encoded as described above.

Referring to FIG. 4B, an exemplary configuration of a representative one of the memory blocks 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be preferably formed as a multi-level cell (MLC) storing data information of multiple bits in each cell. The cell strings 221 may be electrically coupled to the corresponding bit lines BL0 to BLm−1, respectively.

FIG. 4B exemplarily illustrates a memory block 211 comprising a NAND-type flash memory cell. However, the semiconductor memory device 200 is not limited to being NAND flash memory. For example, the semiconductor memory device 200 may comprise a NOR-type flash memory, a hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operation including specific operations related to program, erase, and read operations of the semiconductor memory device 200.

The voltage supply 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply 230 may be performed under control of the control circuit 220.

The voltage supply 230 may generate a plurality of variable read voltages for generating a plurality of read data.

The voltage transmitter 240 may select one of the memory blocks 211 or sectors of the memory cell array 210, and may select one of the word lines of the selected memory block under the control of the control circuit 220. The voltage transmitter 240 may provide the word line voltage generated from the voltage supply 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selector 260 may output the data read from the read/write circuit 250 to another component, for example, to the memory controller 100, based on column address information. On the other hand, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

The read operation on the data stored in the semiconductor memory device 200 may include a hard read operation and a soft read operation.

In a hard read operation data is read from the semiconductor memory device 200 using a reference read voltage. The reference read voltage is distinguishes between two adjacent logic states among a plurality of logic states, which are described with reference to FIG. 5.

In a soft read operation data is read from the semiconductor memory device 200 using different soft read voltages, each of which is different than the reference read voltage. For example, the soft read operation may be performed on memory cells using the soft read voltages after one or more hard read voltages are applied. A reliability value may be assigned to data, which is read using the hard read voltages, by the data read using the soft read voltages.

Figure 5:
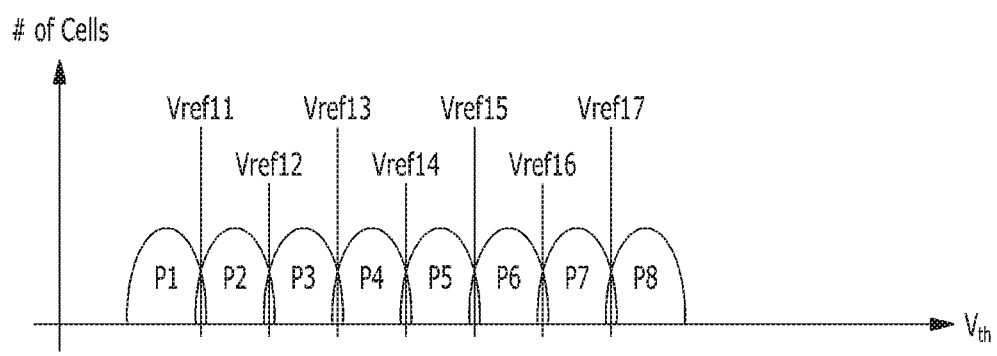
FIG. 5 is a diagram illustrating a threshold voltage distribution of memory cells for describing a reference read voltage.

FIG. 5 is a diagram illustrating a threshold voltage distribution of memory cells for describing a reference read voltage.

The processor 120 may not accurately know the threshold voltage distribution of the memory cells, but may estimate average threshold voltages of respective logic states P1 to P8. The average threshold voltages of the respective logic states may be determined by various methods. Each of logic states P1 to P8 may be also referred to as an erase state or a program state.

For example, the processor 120 may use a Gaussian modeling technique to estimate the average threshold voltages of the respective logic states P1 to P8 of the memory cells. The processor 120 may calculate the number of cells within each of distinct threshold voltage sections by read voltages, based on data read from the memory cells by applying the read voltages to the memory cells. The processor 120 may estimate average threshold voltages of the respective logic states P1 to P8 based on the calculated number of cells within each of threshold voltage sections and a Gaussian distribution function. The processor 120 may estimate first reference read voltages Vref11 to Vref17 for reading data stored in the semiconductor memory device 200 based on the average threshold voltages. For example, the processor 120 may determine, as the reference read voltage, a voltage between average threshold voltages of two adjacent logic states. In a case of a TLC memory cell having eight logic states P1 to P8, seven first reference read voltages Vref11 to Vref17 may be determined.

Each of the first reference read voltages Vref11 to Vref17 may distinguish between two adjacent logic states. For example, in a case where a third read voltage that distinguishes between second and third logic states P2 and P3 and is applied to memory cells, when a memory cell is in an on-state, the memory cell may be determined to have the second logic state P2, and when a memory cell is in an off-state, the memory cell may be determined to have the third logic state P3.

However, when the third read voltage is applied to a memory cell having a threshold voltage in a range in which the second logic state P2 and the third logic state P3 overlap, the memory cell may be read as being in the on-state even though the memory cell is of the third logic state P3. Therefore, as threshold voltage distributions overlap, a number of error bits may be included in read data. The ECC decoder 133 may fail in an error correction decoding operation on the read data when the number of error bits in the data is higher than a correctable error bit limit.

The processor 120 may perform a soft read operation by using soft read voltages different from the reference read voltage. The ECC decoder 133 may assign a reliability value to the data, which is read, based on data read by the soft read operation, and perform a soft decision decoding operation by using the reliability value.

Figure 6:
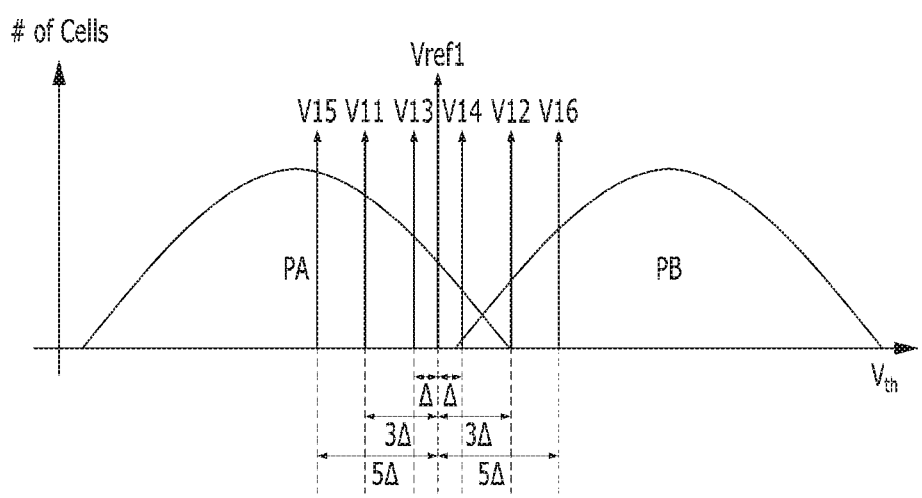
FIG. 6 is a diagram illustrating a threshold voltage distribution of memory cells for describing a soft read voltage.

FIG. 6 is a diagram illustrating a threshold voltage distribution of memory cells for describing a soft read voltage.

FIG. 6 illustrates a first reference read voltage Vref1 between a logic state A (PA) and a logic state B (PB) and first soft read voltages V11 to V16 on the periphery of the first reference read voltage Vref1.

The logic state A (PA) and the logic state B (PB) represent two random adjacent logic states among the logic states P1 to P8 described above with reference to FIG. 5. In addition, the first reference read voltage Vref1 may be any one of the first reference read voltages Vref11 to Vref17 described above with reference to FIG. 5.

In an example of FIG. 6, the first soft read voltages V11 to V16 may be distributed about the first reference read voltage Vref1. In the illustrated embodiment, three of the first soft read voltages (V11, V13 and V15) are on one side of Vref1 and the other three of the first soft read voltages (V12, V14, V16) are on the other side of Vref1. Each of the first soft read voltages is spaced a specific offset from Vref1, as shown in FIG. 6. The first soft read voltages may be symmetrically located about Vref1, as also shown in FIG. 6.

The ECC decoder 133 may assign a reliability value to data, which is read from the semiconductor memory device 200, based on data read using at least some of the first soft read voltages V11 to V16. For example, the reliability value may be a log likelihood ratio (LLR). The ECC decoder 133 may detect and correct an error of encoded data, that is, a codeword, read from the semiconductor memory device 200, by using the reliability value.

As the processor 120 controls the read operation of the semiconductor memory device 200 by using more of the first soft read voltages V11 to V16, the ECC decoder 133 may assign a more accurate reliability value to the data read from the semiconductor memory device 200.

FIGS. 7A to 7G are diagrams illustrating threshold voltage distributions for describing reliability values according to first soft read voltages.

Figure 7A:
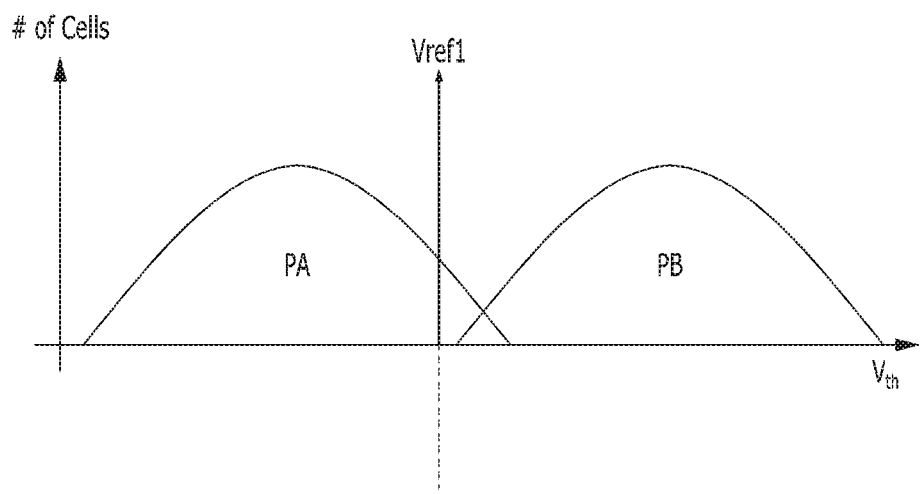
FIGS. 7A to 7G are diagrams illustrating threshold voltage distributions for describing a reliability value according to first soft read voltages.

FIG. 7A illustrates the first reference read voltage Vref1. The processor 120 may control the semiconductor memory device 200 to apply the first reference read voltage Vref1, thereby distinguishing between logic state A (PA) and logic state B (PB) adjacent to each other. In a threshold voltage section where the logic state A (PA) and the logic state B (PB) overlap, the logic state may be incorrectly differentiated. The processor 120 may not know how reliable the data read by the first reference read voltage Vref1 is.

The closer a threshold voltage of a memory cell is to the first reference read voltage Vref1, the lower the reliability of data read from the corresponding memory cell may be. This is because the logic state A (PA) and the logic state B (PB) may overlap on the periphery of the first reference read voltage Vref1. Accordingly, the processor 120 may determine how close the threshold voltage is to the first reference read voltage Vref1, by using the first soft read voltages V11 to V16. The ECC decoder 133 may assign a lower reliability value to a memory cell having a threshold voltage closer to the first reference read voltage Vref1.

Figure 7B:
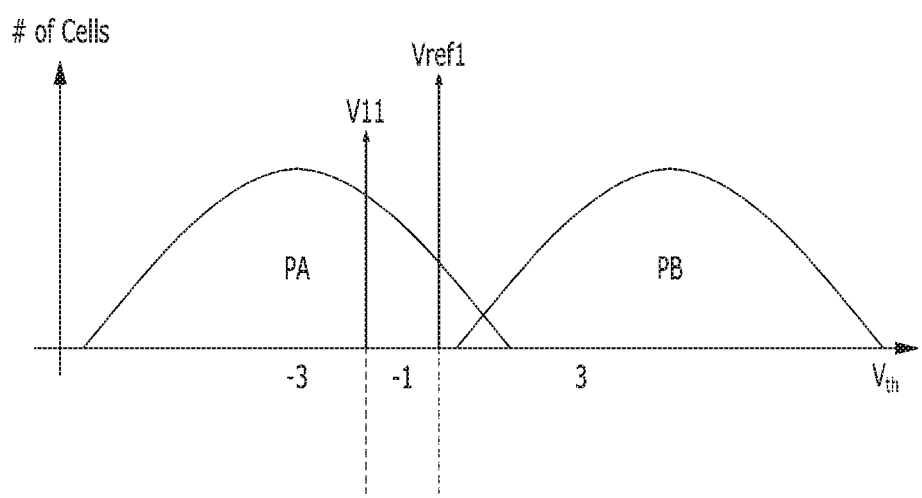
Figure 7C:
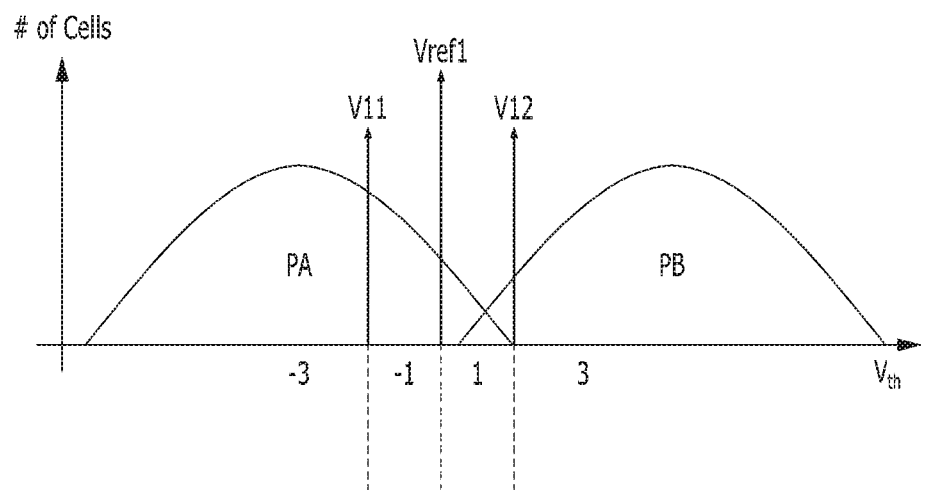
Figure 7D:
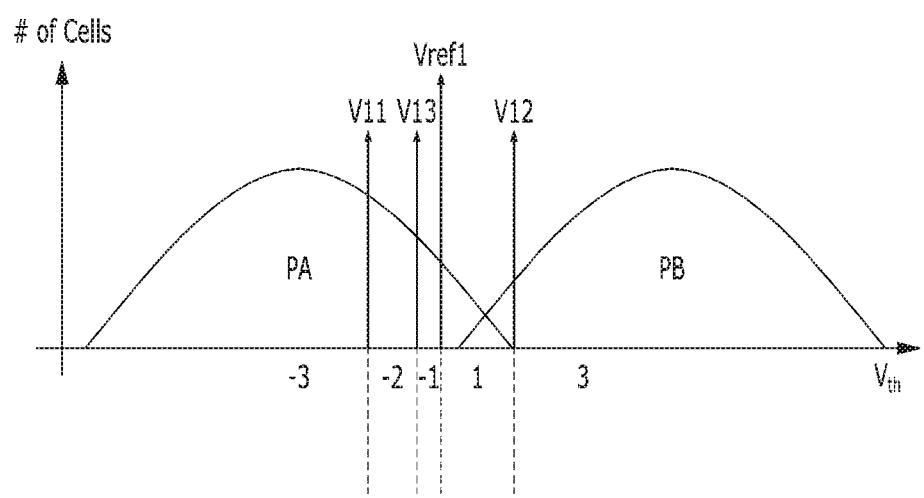
Figure 7E:
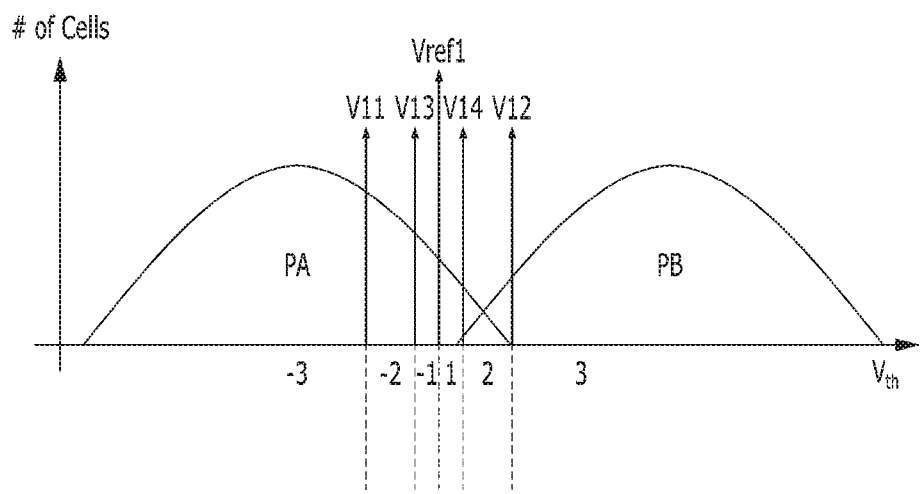
Figure 7F:
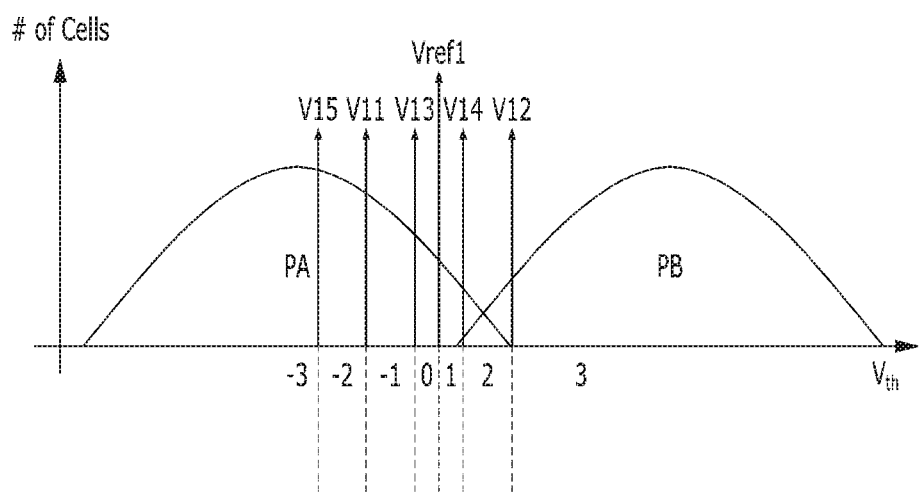
Figure 7G:
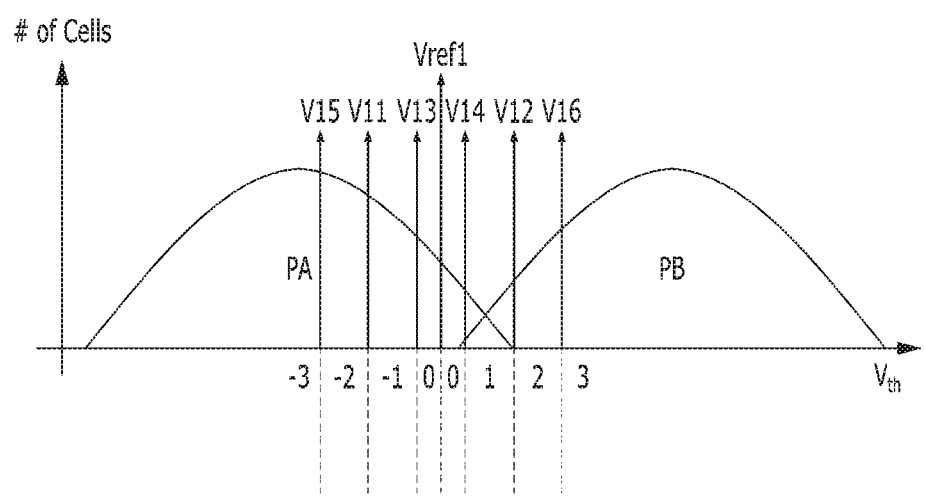

FIG. 7B illustrates the first reference read voltage Vref1 and the soft read voltage V11 among the first soft read voltages V11 to V16.

The ECC decoder 133 may assign a reliability value to a value read by the first reference read voltage Vref1, based on data which is read using the soft read voltage V11.

The processor 120 may distinguish the memory cells among three threshold voltage sections according to data read from the memory cells using two read voltages. For example, when the processor 120 applies the first reference read voltage Vref1 and the soft read voltage V11, memory cells having a threshold voltage less than the soft read voltage V11 may be determined to have a value of "11". Memory cells having a threshold voltage equal to or greater than the soft read voltage V11 and less than the first reference read voltage Vref1 may be determined to have a value of "01", for example, and memory cells having a threshold voltage equal to or greater than the first reference read voltage Vref1 may be determined to have a value of "00", for example. Herein, a threshold voltage section differentiated by the soft and reference read voltages is referred to as a "bin label".

The ECC decoder 133 may assign a reliability value to each of the memory cells according to bin labels to which the respective memory cells belong. The ECC decoder 133 may assign low reliability to memory cells belonging to a bin label close to the first reference read voltage Vref1. In an example of FIG. 7B, the processor 120 may assign a reliability value of "−3" to a memory cell determined to have a value of "11", a reliability value of "−1" to a memory cell determined to have a value of "01", and a reliability value of "3" to a memory cell determined to have a value of "00". The greater the absolute value of the reliability value, the higher the reliability of the determined value. The lower the absolute value of the reliability value, the lower the reliability of the determined value.

FIGS. 7C to 7G represent reliability values of memory cells when a larger number of first soft read voltages are used than in FIG. 7B. In an example of FIG. 7G, when data is read using six first soft read voltages V11 to V16, the memory cells may be sorted into seven bin labels, and one of seven reliability values may be assigned to each of the memory cells.

Referring to 7C to 7G, when the read operation is performed using a larger number of read voltages, the ECC decoder 133 may obtain a more accurate reliability value. The ECC decoder 133 may successfully perform a first soft decision decoding operation by using the more accurate reliability value.

Even though the ECC decoder 133 performs the first soft decision decoding operation by using first soft read data obtained based on the first soft read voltages V11 to V16, the ECC decoder 133 may fail in error correction of the data. When the ECC decoder 133 fails the error correction performed through the first soft decision decoding operation, the processor 120 may determine a second soft read voltage based on the first soft read data.

Figure 8:
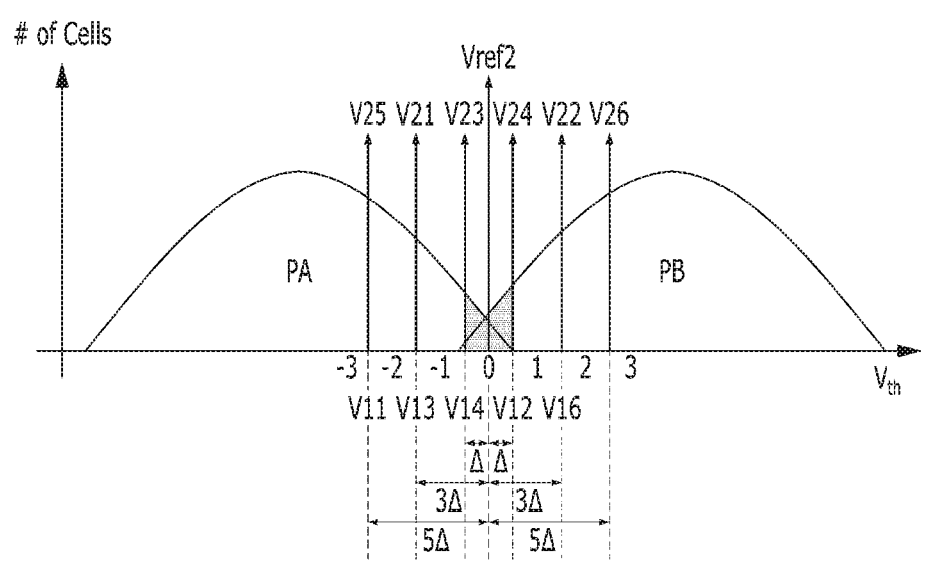
FIG. 8 is a diagram illustrating a threshold voltage distribution of memory cells for describing a second soft read voltage.

FIG. 8 is a diagram illustrating a threshold voltage distribution of memory cells for describing a second soft read voltage.

The processor 120 may determine a second reference read voltage Vref2 based on first soft read data. In addition, the processor 120 may determine second soft read voltages V21 to V26 each having a fixed offset from the second reference read voltage Vref2, as shown in FIG. 8.

The processor 120 may determine to which bin label each of the read memory cells belongs based on the first soft read data. The processor 120 may determine how many memory cells belong to each bin label. The processor 120 may determine, as the second reference read voltage Vref2, a center threshold voltage of the bin label to which the smallest number of memory cells belong.

When determining the second soft read voltages V21 to V26 based on the second reference read voltage Vref2, the processor 120 may use the same offset as when determining the first soft read voltages V11 to V16.

The ECC decoder 133 may assign a reliability value to memory cells, based on data read using the second soft read voltages V21 to V26, and perform a second soft decision decoding operation by using the reliability value. The ECC decoder 133 may successfully recover data on which the first soft decision decoding operation has failed, by performing the second soft decision decoding operation on the data.

When the processor 120 performs a second soft read operation with all the second soft read voltages V21 to V26 for the second soft decision decoding operation of the ECC decoder 133, the time required for error recovery of the read data may be increased.

When the processor 120 determines the second soft read voltages V21 to V26 as described with reference to FIG. 8, at least some of the second soft read voltages V21 to V26 may be the same as some among the first soft read voltages V11 to V16. Herein, among the second soft read voltages V21 to V26, each that is the same as one of the first soft read voltages V11 to V16 is referred to as a common read voltage. Each voltage of the second soft read voltages V21 to V26 that is not the same as one of the first soft read voltages V11 to V16 is referred to as an additional read voltage. In an example of FIG. 8, soft read voltages V21 to V25 are common read voltages, and soft read voltage V26 is the additional read voltage.

According to the present embodiment, the processor 120 may perform the second soft read operation by using the additional read voltage among the second soft read voltages, and obtain second soft read data. The processor 120 may not perform the second soft read operation using the common read voltages among the second soft read voltages.

The ECC decoder 133 may obtain read data for the common read voltages from the first soft read data. The ECC decoder 133 may obtain read data for the second soft read voltages based on the first and second soft read data. The ECC decoder 133 may determine a bin label for each memory cell based on the data read using the second soft read voltages and determine a reliability value for each memory cell based on the bin label. Referring to FIG. 8, the memory cells may be sorted into seven bin labels based on the six second soft read voltages V21 to V26, and one of seven reliability values may be assigned to each of the memory cells. The ECC decoder 133 may perform the second soft decision decoding operation based on the reliability value.

According to the present embodiment, the read operation for the common read voltages may be omitted for the second soft decision decoding operation. Referring to FIG. 8, the number of additional read voltages of the six second soft read voltages V21 to V26 is only a maximum of two. For example, when the bin label between soft read voltages V12 and V16 includes the smallest number of memory cells according to the first soft read data or the bin label between soft read voltages V15 and V11 includes the smallest number of memory cells, the number of additional read voltages may be two. The time required to perform the error correction decoding operation is not much less than the time required to perform the read operation. Therefore, according to the present embodiment, the time required to perform the second soft decision decoding operation may be shortened by ⅓ or more. Accordingly, the memory controller 100 may reduce the time required for error recovery of data read from the semiconductor memory device 200.

Figure 9:
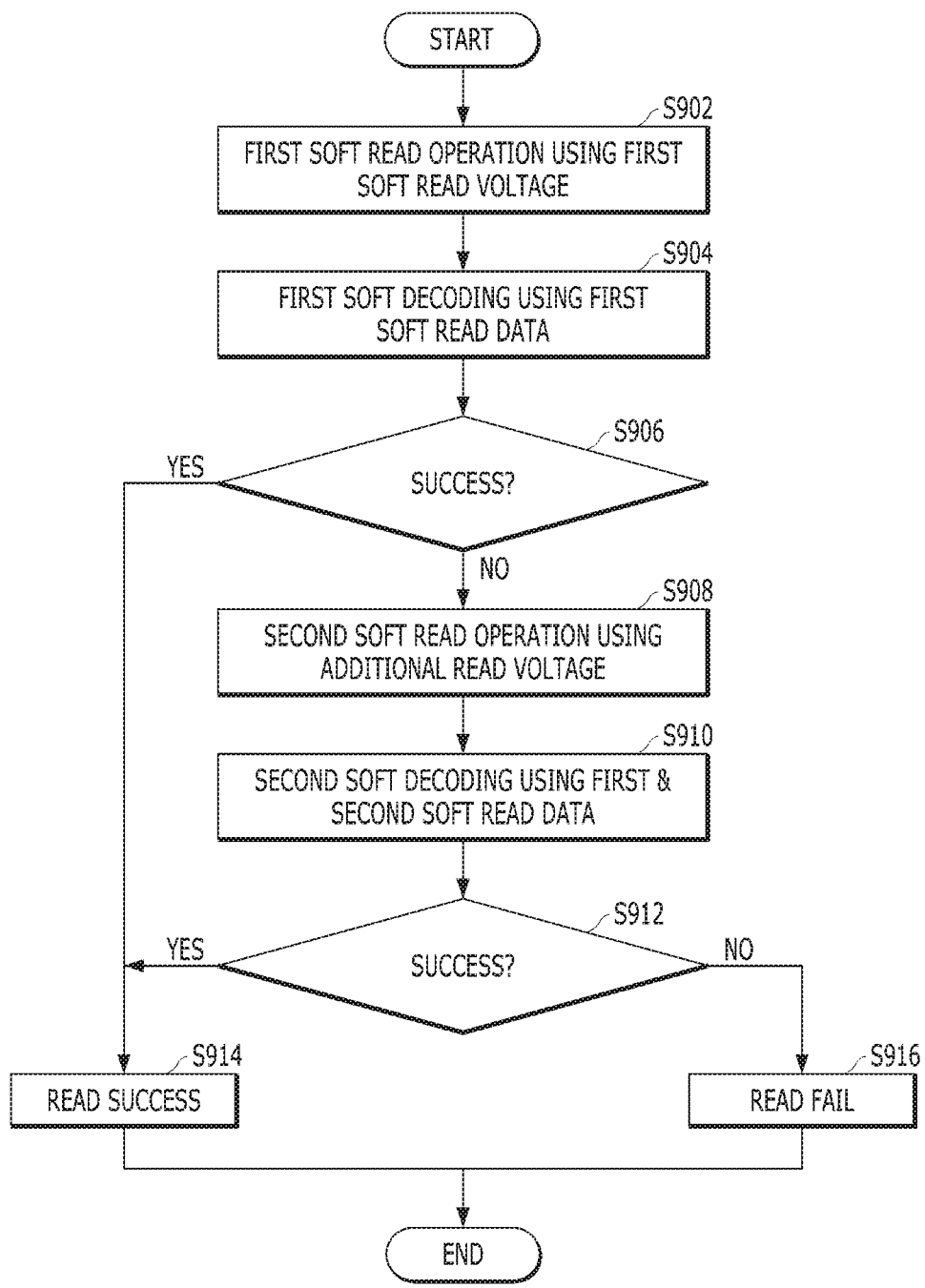
FIG. 9 is a diagram illustrating an operation of a memory controller in accordance with an embodiment.

FIG. 9 is a diagram illustrating an operation of the memory controller 100 in accordance with an embodiment.

In operation S902, the processor 120 may control the semiconductor memory device 200 to perform a first soft read operation by using first soft read voltages.

According to the present embodiment, the processor 120 may determine first reference voltages for distinguishing between adjacent logic states by using a Gaussian modeling technique to carry out the operation S902. In addition, the processor 120 may determine a plurality of first soft read voltages each having a fixed offset from a corresponding one of the first reference voltages.

The control circuit 220 of the semiconductor memory device 200 may control the voltage supply 230 to generate the first soft read voltages in response to a command from the processor 120. The voltage transmitter 240 may apply the first soft read voltages, generated from the voltage supply 230, to a selected word line. The read/write circuit 250 may output data, which is buffered in a page buffer, to the memory 110 as first soft read data according to each of the first soft read voltages and a threshold voltage of the memory cell.

In operation S904, the ECC decoder 133 may perform a first soft decision decoding operation by using the first soft read data.

For example, the ECC decoder 133 may assign a reliability value for each memory cell based on a bin label of the first soft read data stored in the memory 110. The ECC decoder 133 may perform an LDPC decoding operation based on the reliability value.

In operation S906, the ECC decoder 133 may determine whether the first soft decision decoding operation was successfully performed.

For example, the ECC decoder 133 may determine that the first soft decision decoding operation has been successfully performed, when a result obtained by performing the operation on first soft decision decoded data and a parity check matrix is a zero matrix.

When it is determined that the first soft decision decoding operation has been successfully performed (that is, "YES" in operation S906), the processor 120 may determine that a read operation has been successfully performed, in operation S914. The processor 120 may output data, recovered by the first soft decision decoding operation, to a device external to the memory controller 100 or use the recovered data within the processor 120 or memory controller 100.

When it is determined that the first soft decision decoding operation has failed (that is, "NO" in operation S906), the processor 120 may control the semiconductor memory device 200 to perform a second soft read operation by using one or more additional read voltages, in operation S908.

The processor 120 may determine second reference voltages based on the first soft read data, in order to carry out the operation S908. The processor 120 may determine a plurality of second soft read voltages each having a fixed offset from a corresponding one of the second reference voltages. The processor 120 may determine additional read voltages that are different from first read voltages among the second soft read voltages as well as common read voltages that are the same as some of the respective first soft read voltages.

The control circuit 220 of the semiconductor memory device 200 may control the voltage supply 230 to generate the additional read voltages in response to a command from the processor 120. The voltage transmitter 240 may apply the additional read voltages, which are generated from the voltage supply 230, to a selected word line. The read/write circuit 250 may output data, buffered in the page buffer, to the memory 110 as second soft read data according to each of the additional read voltages and a threshold voltage of the memory cell.

In operation S910, the ECC decoder 133 may perform a second soft decision decoding operation by using the first and second soft read data.

The ECC decoder 133 may obtain the first soft read data as a result of the read operation for a common read voltage, and obtain the second soft read data as a result of the read operation using the additional read voltages. Accordingly, the ECC decoder 133 may obtain a result of the read operation using the second soft read voltages by using the first and second soft read data. The ECC decoder 133 may determine a bin label for each memory cell based on the result of the read operation and assign a reliability value for each memory cell based on the determined bin label. The ECC decoder 133 may perform the second soft decision decoding operation based on the reliability value for each memory cell.

In operation S912, the ECC decoder 133 may determine whether the second soft decision decoding operation is successfully performed.

For example, the ECC decoder 133 may determine that the second soft decision decoding operation has been successfully performed when a result obtained by performing the operation on second soft decision decoded data and a parity check matrix is a zero matrix.

When it is determined that the second soft decision decoding operation has been successfully performed (that is, "YES" in operation S912), the ECC decoder 133 may determine that the read operation has been successfully performed, in operation S914. The processor 120 may output data, recovered by the second soft decision decoding operation, to a device external to the memory controller 100 or use the recovered data within the processor 120 or memory controller 100.

When it is determined that the second soft decision decoding operation has failed (that is, "NO" in operation S912), the ECC decoder 133 may determine that the read operation has failed, in operation S916. For example, the processor 120 may provide an external device with a read failure signal according to the determination of the ECC decoder 133.

According to the present embodiment, the memory controller 100 may reduce the time required to perform the second soft decision decoding operation by omitting the read operation by the common read voltage(s). Accordingly, the memory controller 100 may rapidly recover the data read from the semiconductor memory device 200, thereby improving performance of the semiconductor memory system 10.

Figure 10:
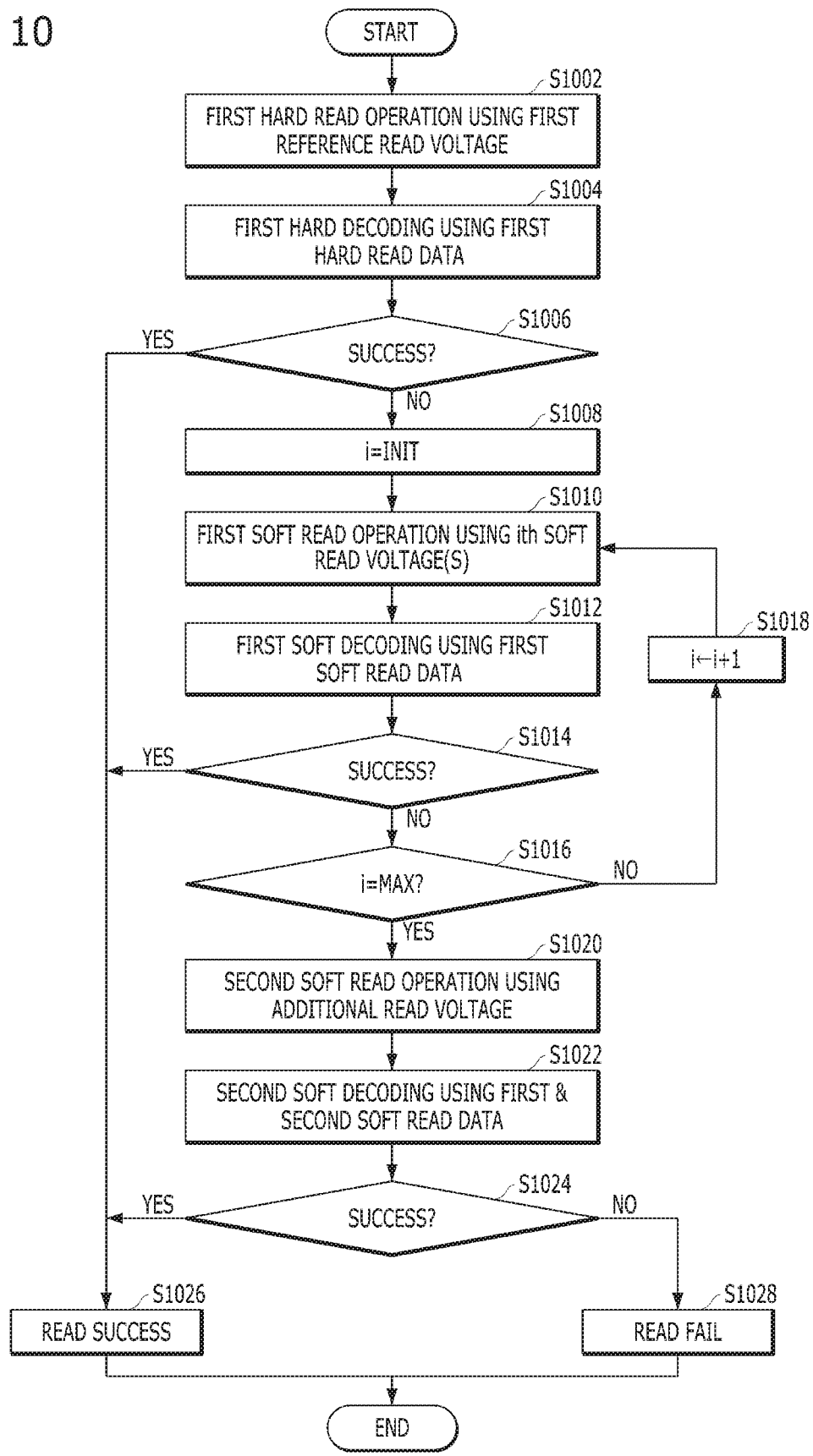
FIG. 10 is a diagram illustrating an operation of a memory controller in accordance with another embodiment.

FIG. 10 is a diagram illustrating an operation of the memory controller 100 in accordance with another embodiment.

In operation S1002, the processor 120 may control the semiconductor memory device 200 to perform a first hard read operation by using a first reference voltage. The semiconductor memory device 200 may perform the first hard read operation, and output first hard read data to the memory 110.

According to the present embodiment, the processor 120 may determine first reference voltages by using a Gaussian modeling technique, in order to carry out the operation S1002.

In operation S1004, the ECC decoder 133 may perform a first hard decision decoding operation by using the first hard read data. For example, the first hard decision decoding operation may be an LDPC decoding operation.

In operation S1006, the ECC decoder 133 may determine whether the first hard decision decoding operation was successfully performed. For example, when a result obtained by performing the operation on first hard decision decoded data and a parity check matrix is a zero matrix, the ECC decoder 133 may determine that the first hard decision decoding operation has been successfully performed.

When it is determined that the first hard decision decoding operation has been successfully performed (that is, "YES" in operation S1006), the processor 120 may determine that the read operation has been successfully performed, in operation S1026. The processor 120 may output data, recovered by the first hard decision decoding operation, to a device external to the memory controller 100 or use the recovered data within the processor 120 or the memory controller 100.

When it is determined that the first hard decision decoding operation has failed (that is, "NO" in operation S1006), the processor 120 may perform a first soft decision decoding operation in S1008, S1010, S1012, S1014 and S1016. The processor 120 may repeatedly perform the operations of S1010, S1012, S1014 and S1016 until the first soft decision decoding operation is successfully performed or all the first soft read voltages are used one by one. That is, the soft read operation may be repeatedly performed using a respective one of the soft read voltages each time.

The processor 120 may initialize a variable "i" in operation S1008 and control the semiconductor memory device 200 to perform a first soft read operation by using an $i^{th}$ soft read voltage in operation S1010.

For example, the processor 120 may initialize the variable "i" so that the soft read voltages starting from the soft read voltage V11 described with reference to FIG. 6 may be used to perform the first soft read operation. In addition, the processor 120 may control the semiconductor memory device 200 to perform the first soft read operation based on the soft read voltage V11. The semiconductor memory device 200 may perform the first soft read operation, and output first soft read data to the memory 110.

In operation S1012, the ECC decoder 133 may perform a first soft decision decoding operation by using the first soft read data.

For example, the ECC decoder 133 may assign a reliability value to data read by the hard read operation according to a bin label for each memory cell determined based on the first soft read data so far.

In operation S1014, the ECC decoder 133 may determine whether the first soft decision decoding operation is successfully performed.

For example, the ECC decoder 133 may determine that the first soft decision decoding operation has been successfully performed when a result obtained by performing the operation on first soft decision decoded data and a parity check matrix is a zero matrix.

When it is determined that the first soft decision decoding operation has been successfully performed (that is, "YES" in operation S1014), the processor 120 may determine that the read operation has been successfully performed, in operation S1026. The processor 120 may output data, recovered by the first soft decision decoding operation, to a device external to the memory controller 100 or use the recovered data within the processor 120 or memory controller 100.

When it is determined that the first soft decision decoding operation has failed (that is, "NO" in operation S1014), the processor 120 may determine whether the variable "i" has a maximum value, in operation S1016. When the variable "i"

has the maximum value that indicates that the first soft read operation has been performed on all the first soft read voltages. For example, when the variable "i" is 16 indicating soft read voltage V16 described with reference to FIG. 6, the variable "i" may be determined to have the maximum value.

When the variable "i" does not have the maximum value (that is, "NO" in operation S1016), the processor 120 may increase the variable "i" by 1 in operation S1018. By repeatedly performing operations S1010, S1012, S1014 and S1016, the processor 120 may control the read operation of the semiconductor memory device 200 with a next first soft read voltage, and the ECC decoder 133 may perform the first decision decoding operation based on the first soft read data so far. As described with reference to FIGS. 7A to 7G, as the reliability value becomes more accurate for each repeated operation, and even though the ECC decoder 133 has failed in a previous first soft decision decoding operation, the ECC decoder 133 may successfully perform a successive first soft decision decoding operation.

When the variable "i" has the maximum value (that is, "YES" in operation S1016), the processor 120 may determine that the first soft decision decoding operation has finally failed, and control the semiconductor memory device 200 to perform a second soft read operation by using additional read voltages, in operation S1020.

Operations S1020, S1022, S1024, S1026 and S1028 may be the same as operations S908, S910, S912, S914 and S916 described with reference to FIG. 9. That is, the processor 120 may control the semiconductor memory device 200 to perform a read operation using only the additional read voltages when failing to perform the first soft decision decoding operation and performing the second soft decision decoding operation. The ECC decoder 133 may perform a second soft decision decoding operation by second soft read voltages based on the first soft read data and second soft read data stored in the memory 110. Accordingly, the memory controller 100 may reduce the time required to perform the second soft decision decoding operation by omitting the read operation by a common read voltage, and improve performance of the semiconductor memory system 10.

The embodiments of the present disclosure may provide a controller and a memory system which may accurately and rapidly read data stored in a memory cell.

While the present disclosure has been described with respect to specific embodiments, it will be apparent to those skilled in the art that various changes and modifications may be made without departing from the spirit and scope of the invention as defined in the following claims. Therefore, the scope of the present invention is not limited to the above-described embodiments. Rather, the present invention encompasses all changes, modifications and variations that fall within the scope of the claims and their equivalents.

What is claimed is:

1. A controller that controls a memory device, comprising:
a processor suitable for controlling the memory device to perform a first soft read operation by using first soft read voltages; and
an error correction code (ECC) codec suitable for performing a first soft decision decoding operation based on first soft read data obtained through the first soft read operation,
wherein the processor controls the memory device to perform a second soft read operation with an additional read voltage, of second soft read voltages, that is different than any of the first soft read voltages and which is determined based on the first soft read data, according to whether the first soft decision decoding operation failed,
wherein the ECC codec performs a second soft decision decoding operation based on the first soft read data and second soft read data obtained through the second soft read operation,
wherein the processor performs a first operation of controlling the memory device to perform the first soft read operation by using any one of the first soft read voltages,
wherein the ECC codec performs a second operation of performing the first soft decision decoding operation based on the first soft read data obtained through performance of the first soft read operation, and
wherein the processor and the ECC codec repeatedly perform the first and second operations until the first soft decision decoding operation is successfully performed or reaches a set number of iterations.

2. The controller of claim 1, wherein the processor determines the first soft read voltages as having respective offsets from a first reference read voltage.

3. The controller of claim 2, wherein the processor determines, as the first reference read voltage, a voltage between average threshold voltages of two adjacent logic states within a threshold voltage distribution of memory cells in the memory device based on a Gaussian modeling technique applied to the distribution.

4. The controller of claim 3,
wherein the processor controls the memory device to perform a first hard read operation by using a first reference voltage, and
wherein the ECC codec performs a first hard decision decoding operation based on first hard read data obtained through the first hard read operation before performing the first soft decision decoding operation.

5. The controller of claim 2, wherein the processor determines the second soft read voltages as having respective offsets from a second reference read voltage.

6. The controller of claim 5, wherein the processor determines, as the second reference read voltage, a center threshold voltage of a bin label, to which the smallest number of memory cells belong, among bin labels determined according to the first soft read voltages.

7. The controller of claim 1, further comprising a memory suitable for storing the first and second soft read data.

8. An operating method of a controller that controls a memory device, the operating method comprising:
controlling the memory device to perform a first soft read operation by using first soft read voltages;
performing a first soft decision decoding operation based on first soft read data obtained through the first soft read operation;
controlling the memory device to perform a second soft read operation with an additional read voltage, of second soft read voltages, that is different than any of the first soft read voltages and which is determined based on the first soft read data, according to whether the first soft decision decoding operation failed;
performing a second soft decision decoding operation based on the first soft read data and second soft read data obtained through the second soft read operation;
determining the first soft read voltages as having respective offsets from a first reference read voltage; and
determining, as the first reference read voltage, a voltage between average threshold voltages of two adjacent logic states within a threshold voltage distribution of memory cells in the memory device based on a Gaussian modeling technique applied to the distribution.

9. The operating method of claim 8, further comprising:
controlling the memory device to perform a first hard read operation by using a first reference voltage; and
performing a first hard decision decoding operation based on first hard read data obtained through the first hard read operation before performing the first soft decision decoding operation.

10. The operating method of claim 8, further comprising determining the second soft read voltages as having respective offsets from a second reference read voltage.

11. The operating method of claim 10, further comprising determining, as the second reference read voltage, a center threshold voltage of a bin label, to which the smallest number of memory cells belong, among bin labels determined according to the first soft read voltages.

12. The operating method of claim 8,
wherein the controlling of the memory device to perform the first soft read operation by using the first soft read voltages includes a first operation of controlling the memory device to perform the first soft read operation by using any one of the first soft read voltages, and
wherein the performing of the first soft decision decoding operation based on the first soft read data obtained through the first soft read operation includes a second operation of performing the first soft decision decoding operation based on the first soft read data obtained through performance of the first soft read operation, and
further comprising repeatedly performing the first and second operations until the first soft decision decoding operation is successfully performed or reaches a set number of iterations.

13. An error correcting method of a controller, the method comprising:
performing a first soft decision decoding operation on first data read using different first read voltages; and
performing, when the first decision decoding operation fails, a second soft decision decoding operation on second data according to second read voltages determined on a basis of the first data, the second read voltages,
wherein the second read voltages includes one or more of the first read voltages and one or more third read voltages different from the first read voltages, and
wherein the second data includes one or more pieces of the first data read by first read voltages during the first soft decision decoding operation and third data read by the one or more third read voltages during the second soft decision decoding operation.

* * * * *